(12) United States Patent
Allore et al.

(10) Patent No.: US 10,477,713 B2
(45) Date of Patent: Nov. 12, 2019

(54) SINGLE-PIECE METAL HOUSING WITH INTEGRAL ANTENNAS

(71) Applicant: Motorola Mobility LLC, Chicago, IL (US)

(72) Inventors: Joseph L Allore, Mundelein, IL (US); Mohammed R Abdul-Gaffoor, Palatine, IL (US); Michael J Lombardi, Lake Zurich, IL (US)

(73) Assignee: Motorola Mobility LLC, Chicago, IL (US)

( * ) Notice: Subject to any disclaimer, the term of this patent is extended or adjusted under 35 U.S.C. 154(b) by 1054 days.

(21) Appl. No.: 14/613,406

(22) Filed: Feb. 4, 2015

(65) Prior Publication Data

US 2016/0226130 A1 Aug. 4, 2016

(51) Int. Cl.
*H01Q 1/24* (2006.01)
*H05K 5/02* (2006.01)

(52) U.S. Cl.
CPC ........... *H05K 5/0247* (2013.01); *H01Q 1/243* (2013.01)

(58) Field of Classification Search
CPC ........ H01Q 1/243; H01Q 1/38; H01Q 9/0421; H01Q 1/42; H01Q 1/12
USPC .................. 343/702, 872, 878, 866, 879
See application file for complete search history.

(56) References Cited

U.S. PATENT DOCUMENTS

| | | | |
|---|---|---|---|
| 2004/0257283 A1* | 12/2004 | Asano | H01Q 1/243 343/702 |
| 2005/0012674 A1 | 1/2005 | Takei | |
| 2008/0106412 A1 | 5/2008 | Sakama et al. | |
| 2009/0102724 A1 | 4/2009 | Tsutsumi | |
| 2011/0287715 A1 | 11/2011 | Matsuura et al. | |
| 2012/0009983 A1 | 1/2012 | Mow et al. | |
| 2012/0157175 A1 | 6/2012 | Golko et al. | |
| 2012/0229347 A1* | 9/2012 | Jin | H01Q 1/243 343/702 |
| 2013/0082884 A1 | 4/2013 | Gummalla | |

(Continued)

FOREIGN PATENT DOCUMENTS

CN 203950905 U 11/2014
EP 2996194 A1 3/2016

(Continued)

OTHER PUBLICATIONS

Search Report for related British Application No. GB1601757.6; report dated Jul. 21, 2016.

(Continued)

*Primary Examiner* — Dameon E Levi
*Assistant Examiner* — Collin Dawkins
(74) *Attorney, Agent, or Firm* — McKinney Phillips LLC; Phillip Pippenger (57) ABSTRACT

An enhanced portable communication device includes a one-piece metal back plate, configured to reduce device thickness by eliminating the plastic-to-metal joints normally needed to isolate the device antennas and provide rigidity. The one-piece metal back plate includes four integral antennas in an embodiment, forming an antenna pair at each end of the device. An opening and gap used to form each antenna pair may be filled with a nonconductive material such as plastic. In an embodiment, an I/O port is exposed through the nonconductive material in the gap.

9 Claims, 8 Drawing Sheets

(56) References Cited

U.S. PATENT DOCUMENTS

| | | |
|---|---|---|
| 2013/0194138 A1* | 8/2013 | Hammond ............. H01Q 1/243 |
| | | 343/702 |
| 2014/0028525 A1 | 1/2014 | Ying |
| 2014/0078008 A1* | 3/2014 | Kang ..................... H01Q 5/35 |
| | | 343/702 |
| 2014/0184450 A1 | 7/2014 | Koo et al. |
| 2014/0198012 A1* | 7/2014 | Tseng .................... H01Q 21/28 |
| | | 343/876 |
| 2014/0333486 A1 | 11/2014 | Greetis et al. |
| 2014/0340280 A1 | 11/2014 | Liou et al. |
| 2014/0347226 A1 | 11/2014 | Iellici et al. |

FOREIGN PATENT DOCUMENTS

| | | |
|---|---|---|
| EP | 3012908 A1 | 4/2016 |
| GB | 2516304 A | 1/2015 |

OTHER PUBLICATIONS

Search Report for related British Application No. GB1601757.6; report dated Jun. 23, 2016.

Michael J. Lombardi, et al., "Antenna Link in Ultra-Thin Device with Single-Piece Metal Housing", U.S. Appl. No. 14/681,879, filed Apr. 8, 2015.

Search Report for related British Application No. GB1601757.6; report dated Jul. 19, 2017.

Search Report for related British Application No. GB1601757.6; report dated Feb. 5, 2018.

* cited by examiner

Figure 8

SINGLE-PIECE METAL HOUSING WITH INTEGRAL ANTENNAS

TECHNICAL FIELD

The present disclosure is related generally to mobile device construction, and, more particularly, to a system and method for providing a single-piece metal housing design with integral antennas.

BACKGROUND

In an effort to deliver more premium electronic devices to consumers, cellular phone manufacturers are increasingly using exterior cosmetic housings fabricated from metal alloys. However, the use of metal for an exterior housing in high capability phones or "smartphones" currently requires complex manufacturing techniques. For example, one technique that is used to provide a metal exterior while maintaining the electrical isolation needed by current antenna technology requires the manufacturer to form a single metal housing which is then separated into multiple pieces which are held together by a plastic resin. In particular, the plastic divisions in the metal allow the separate exterior metal pieces to act as antennas while maintaining separation from each other and/or from grounded pieces of metal.

While this technique may provide the needed electrical isolation, it does so at the expense of device integrity. Significant metal to plastic interlock geometry is required to keep the plastic and metal from detaching, and the multiple plastic divisions are cosmetically undesirable. Moreover, only certain grades of plastic may be used, since the plastic must typically survive subsequent processing steps such as molding, anodizing and so on. This limit on usable plastics may also limit other aspects of the device such as color. Moreover, when plastic divisions run across the full width of a device, a double wall section (metal plus plastic) contributes to device thickness.

Finally, it will be appreciated that such devices often require I/O (input/output) ports to fall in the middle of a functional antenna element. Not only does this placement physically disrupt the antenna element, but it may also lead to coupling between the antenna element and the port, requiring that additional precautions be taken.

Certain other devices use a perimeter metal housing instead of a full metal back housing. However, this configuration does not solve the above-noted deficiencies. For example, the corners of the housing in these devices are often used as antennas, and therefore four or more perimeter separators of nonconductive material are needed to isolate the four antennas.

While the present disclosure is directed to a system that can eliminate some of the shortcomings noted in this Background section, it should be appreciated that any such benefit is not a limitation on the scope of the disclosed principles, nor of the attached claims, except to the extent expressly noted in the claims. Additionally, the discussion of technology in this Background section is reflective of the inventors' own observations, considerations, and thoughts, and is in no way intended to accurately catalog or comprehensively summarize the prior art. As such, the inventors expressly disclaim this section as admitted or assumed prior art with respect to the discussed details. Moreover, the identification herein of a desirable course of action reflects the inventors' own observations and ideas, and should not be assumed to indicate an art-recognized desirability.

BRIEF DESCRIPTION OF THE SEVERAL VIEWS OF THE DRAWINGS

While the appended claims set forth the features of the present techniques with particularity, these techniques, together with their objects and advantages, may be best understood from the following detailed description taken in conjunction with the accompanying drawings of which:

DETAILED DESCRIPTION

Before presenting a detailed discussion of embodiments of the disclosed principles, an overview of certain embodiments is given to aid the reader in understanding the later discussion. As noted above, the use of metal for the exterior of a wireless communication device often entails compromises that affect the device function and aesthetic appeal. For example, the metal housing must be divided to electrically isolate certain sections for use as antennas. This results in unsightly plastic joint sections and requires extra care when locating an I/O port through an antenna element.

In an embodiment of the disclosed principles, a novel approach is provided for device configuration and fabrication, wherein a single-piece metal exterior housing is produced to include a plurality of arms. These arms are able to function as antennas in the finished device. In an example wherein four such arms are included, the housing may be configured with two arms at one end of the housing and two arms at the opposite end of the housing.

This design does not require plastic joints on the back of the housing. Rather, each pair of arms is connected to the main body of the housing and the arms are separated from each other at their ends by a small spacer of plastic or other electrically isolating material. The plastic spacer may be over molded to the metal housing or assembled to the metal housing with glue, snaps, screws, etc. Thus the housing need have only two divisions: one between each antenna pair at either end of the part. This single-piece housing offers the additional benefit that the tie-in or joint geometry between metal and plastic need only be present along the perimeter of the device, thus reducing device thickness.

In addition, the use of nano-molding is not required because there are no small individual metal pieces requiring tie-in. The metal is a single piece and only requires the ends of the antenna pairs to be physically but not electrically tied to each other. Finally, an I/O port may be placed within one or both of the plastic antenna splits such that physical separation from each antenna to the I/O port is maintained, improving the overall performance of both antennas.

With this overview in mind, and turning now to a more detailed discussion in conjunction with the attached figures, the techniques of the present disclosure are illustrated as being implemented in a suitable computing environment. The following device description is based on embodiments and examples of the disclosed principles and should not be taken as limiting the claims with regard to alternative embodiments that are not explicitly described herein. Thus, for example, while FIG. 1 illustrates an example mobile device within which embodiments of the disclosed principles may be implemented, it will be appreciated that other device types may be used, including but not limited to personal computers, tablet computers and other devices.

Figure 1:
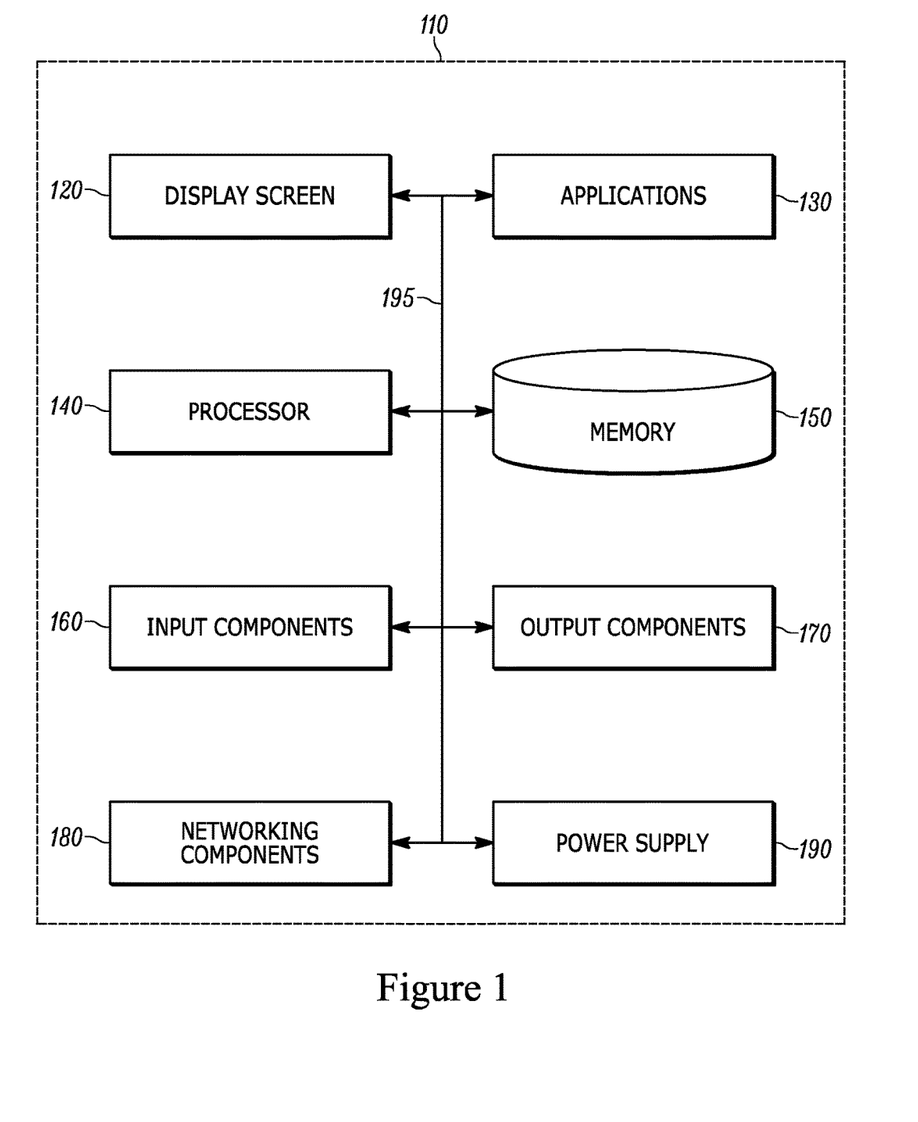
FIG. 1 is a simplified schematic of an example device with respect to which embodiments of the presently disclosed principles may be implemented.

The schematic diagram of FIG. 1 shows an exemplary device 110 forming part of an environment within which aspects of the present disclosure may be implemented. In particular, the schematic diagram illustrates a user device 110 including several exemplary components. It will be appreciated that additional or alternative components may be used in a given implementation depending upon user preference, component availability, price point, and other considerations.

In the illustrated embodiment, the components of the user device 110 include a display screen 120, applications (e.g., programs) 130, a processor 140, a memory 150, one or more input components 160 such as speech and text input facilities, and one or more output components 170 such as text and audible output facilities, e.g., one or more speakers.

The processor 140 can be any of a microprocessor, microcomputer, application-specific integrated circuit, or the like. For example, the processor 140 can be implemented by one or more microprocessors or controllers from any desired family or manufacturer. Similarly, the memory 150 may reside on the same integrated circuit as the processor 140. Additionally or alternatively, the memory 150 may be accessed via a network, e.g., via cloud-based storage. The memory 150 may include a random access memory (i.e., Synchronous Dynamic Random Access Memory (SDRAM), Dynamic Random Access Memory (DRAM), RAMBUS Dynamic Random Access Memory (RDRM) or any other type of random access memory device). Additionally or alternatively, the memory 150 may include a read only memory (i.e., a hard drive, flash memory or any other desired type of memory device).

The information that is stored by the memory 150 can include program code associated with one or more operating systems or applications as well as informational data, e.g., program parameters, process data, etc. The operating system and applications are typically implemented via executable instructions stored in a non-transitory computer readable medium (e.g., memory 150) to control basic functions of the electronic device 110. Such functions may include, for example, interaction among various internal components and storage and retrieval of applications and data to and from the memory 150.

Further with respect to the applications, these typically utilize the operating system to provide more specific functionality, such as file system service and handling of protected and unprotected data stored in the memory 150. Although many applications may provide standard or required functionality of the user device 110, in other cases applications provide optional or specialized functionality, and may be supplied by third party vendors or the device manufacturer.

Finally, with respect to informational data, e.g., program parameters and process data, this non-executable information can be referenced, manipulated, or written by the operating system or an application. Such informational data can include, for example, data that are preprogrammed into the device during manufacture, data that are created by the device or added by the user, or any of a variety of types of information that are uploaded to, downloaded from, or otherwise accessed at servers or other devices with which the device is in communication during its ongoing operation.

The device 110 may include software and hardware networking components 180 to allow communications to and from the device. Such networking components 180 will typically provide wireless networking functionality, although wired networking may additionally or alternatively be supported.

In an embodiment, a power supply 190, such as a battery or fuel cell, may be included for providing power to the device 110 and its components. All or some of the internal components communicate with one another by way of one or more shared or dedicated internal communication links 195, such as an internal bus.

In an embodiment, the device 110 is programmed such that the processor 140 and memory 150 interact with the other components of the device 110 to perform a variety of functions. The processor 140 may include or implement various modules and execute programs for initiating different activities such as launching an application, transferring data, and toggling through various graphical user interface objects (e.g., toggling through various display icons that are linked to executable applications).

Figure 2:
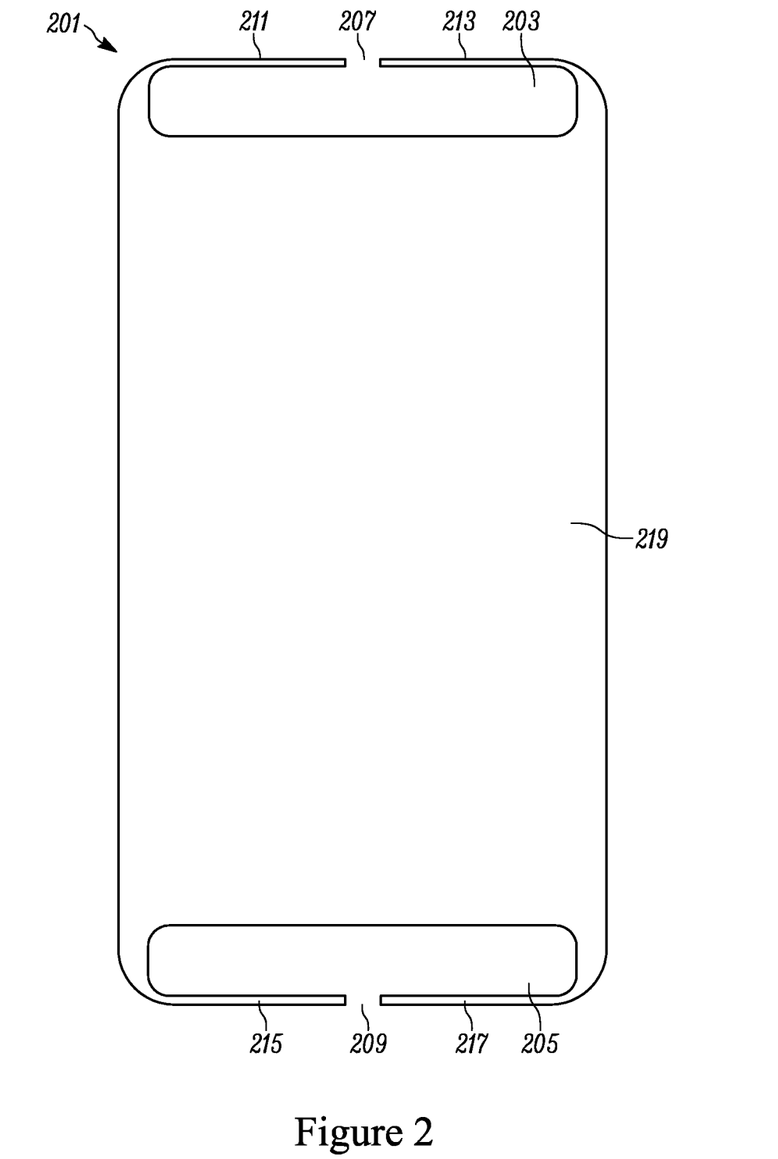
FIG. 2 is a plan view of a one-piece metal back plate in accordance with an embodiment of the described principles.

Turning to FIG. 2, this figure shows a metal back plate 201 for a portable communication device such as device 110 of FIG. 1. In the illustrated example, the metal back plate 201 is formed having a first opening 203 and a second opening 205, with the first opening 203 being located in the upper portion of the metal back plate 201 and the second opening 205 being located in the lower portion of the metal back plate 201.

In addition a break 207 is located in the top of the metal back plate 201, causing the opening 203 to be non-closed. Similarly, a break 209 is located in the bottom of the metal back plate 201, causing the opening 205 to be non-closed. The result of the first opening 203, second opening 205, first break 207 and bottom break 209 is to cause a pair of antenna arms to be formed at both the top and the bottom of the metal back plate 201. In particular, a pair of antenna arms 211, 213 is formed at the top of the metal back plate 201 and another pair of antenna arms 215, 217 is formed at the bottom of the metal back plate 201. The remainder of the metal back plate 201 may be referred to herein as the main body 219 of the metal back plate 201.

Figure 3:
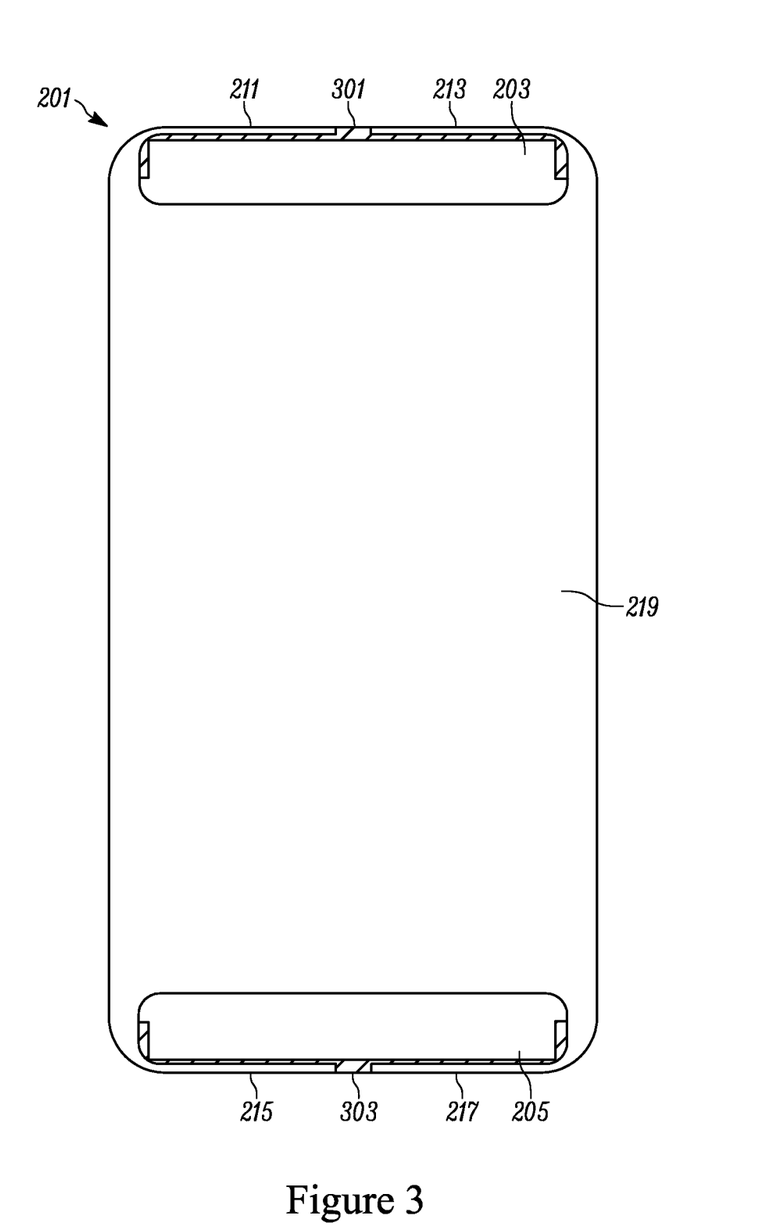
FIG. 3 is a plan view of the one-piece metal back plate of FIG. 2, further including antenna spacers in accordance with an embodiment of the described principles.

FIG. 3 illustrates the metal back plate 201 of FIG. 2 with additional structures thereon. In particular, the metal back plate 201 as shown in FIG. 3 includes a first spacer 301 bridging the gap between the antenna arms 211, 213. The spacer is made of plastic or other non-conducting and includes material within the opening 203 to stabilize the spacer 301 and to insulate other elements.

Similarly, the bottom opening 205 in the metal back plate 201 includes a gap between the pair of antenna arms 215, 217. In the embodiment illustrated in FIG. 3, this gap is bridged via a second spacer 303 bridging the gap between the antenna arms 215, 217. As with the first spacer, the second spacer is made of plastic or other non-conducting and includes material within the opening 205 to stabilize the spacer 303 and to insulate other elements.

Figure 4:
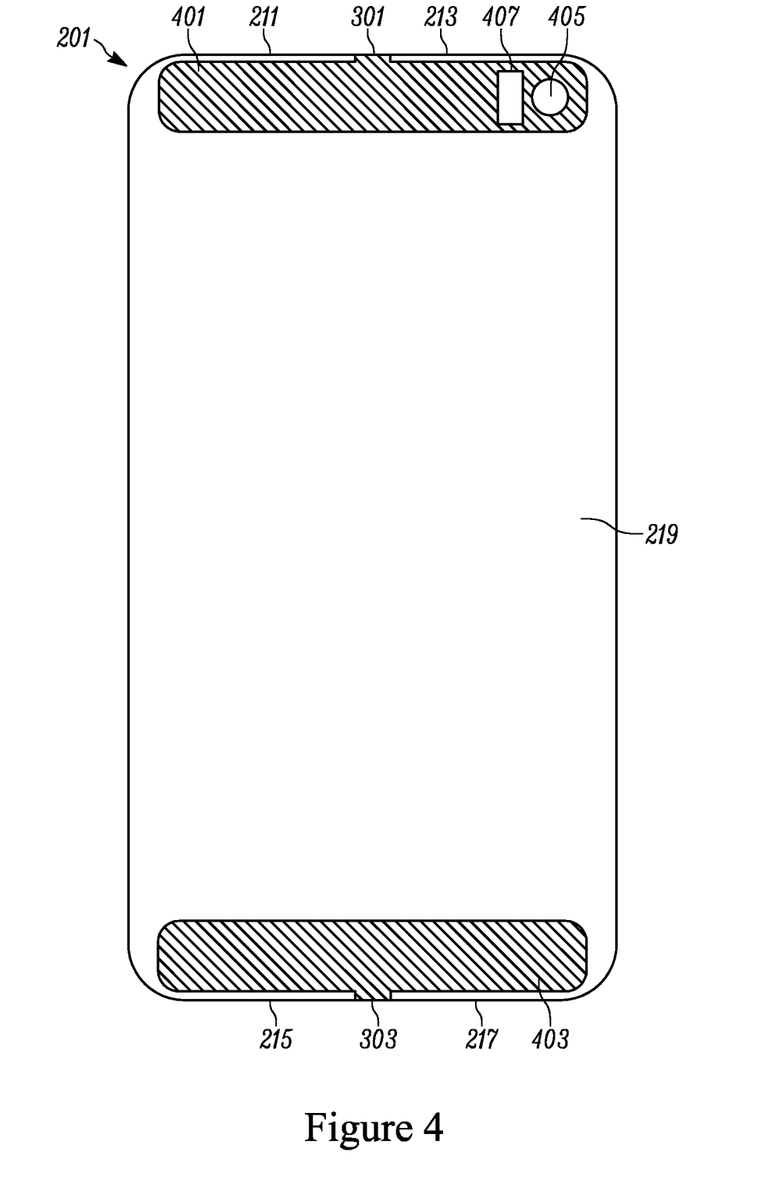
FIG. 4 is a plan view of the one-piece metal back plate of FIGS. 2 and 3, further including additional elements in accordance with an embodiment of the described principles.

Continuing, FIG. 4 illustrates the metal back plate 201 with the openings filled with a nonconductive material 401, 403. This material 401, 403 closes the metal back plate 201 and allows the mounting of externally facing equipment. For example, in the illustrated embodiment, the nonconductive material 401 filler in the top portion of the metal back plate 201 is used as a mount for a camera 405 and an accompanying flash 407. It will be appreciated that additional or alternative equipment may be mounted in the nonconductive material 401, 403 at the top or bottom of the metal back plate 201. Indeed, it is not required to mount any equipment at all in either location.

Figure 5:
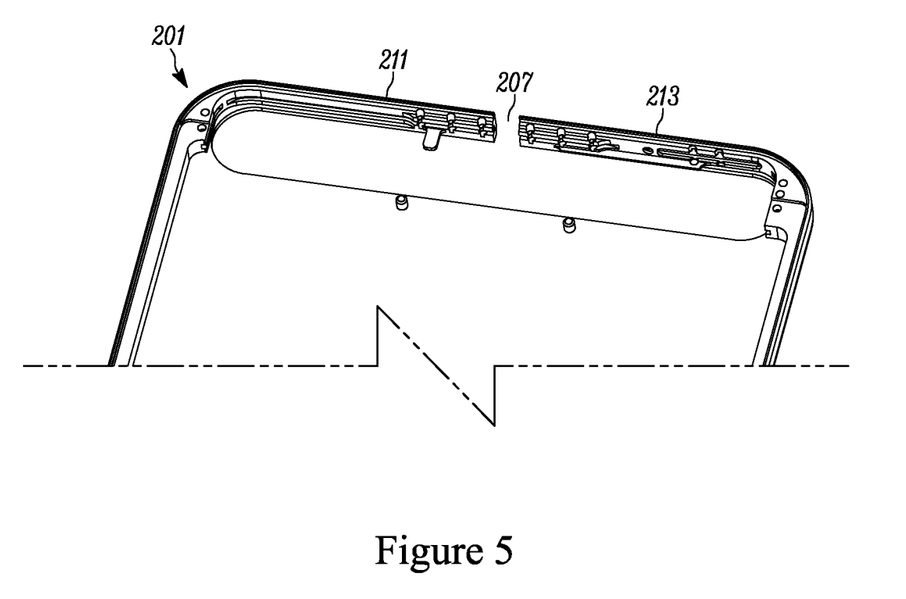
FIG. 5 is a perspective view of a top portion of the one-piece metal back plate of FIGS. 2-4.

Turning now to FIG. 5, this figure shows a front perspective view of the top portion of the metal back plate 201. In this view, it can be seen that the first antenna arm 211 and second antenna arm 213 are thin in the plane of the main body 219 of the metal back plate 201 but may be as thick as the device (FIG. 1) in the direction perpendicular to that plane.

In the illustration of FIG. 5, it can also be seen that the undersides of the antenna arms 211, 213 are formed with slight ribs and indentations to assist interlocking with plastic pieces such as the first spacer 301 bridging the gap between the antenna arms 211, 213 (FIG. 2).

Figure 6:
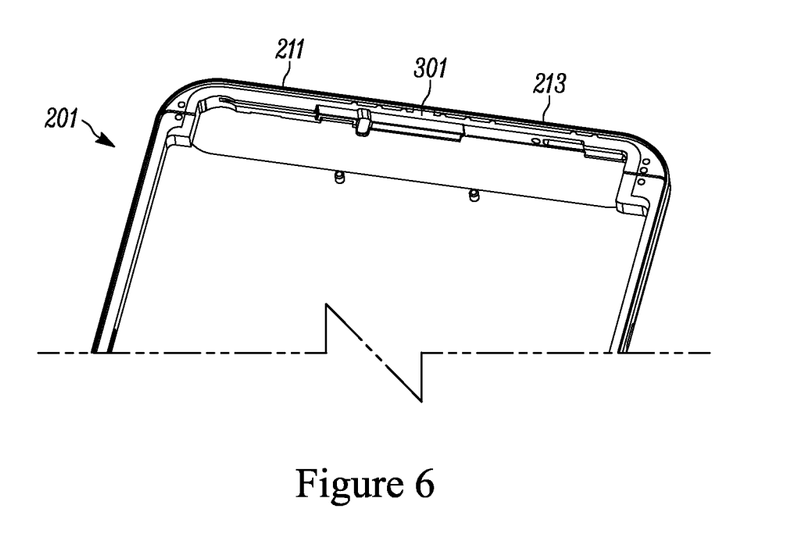
FIG. 6 is a perspective view as in FIG. 5, further including an antenna spacer in accordance with an embodiment of the disclosed principles.

The interlocking and positioning of the first spacer 301 and the antenna arms 211, 213 can be seen in FIG. 6, which shows a front perspective view of the top portion of the metal back plate 201 with the first spacer 301 installed.

While the one-piece metal back plate 201 may be stronger that a multi-piece metal back plate, there may still be a need for reinforcement in certain implementations. For example, the rigidity of body of the device 110, i.e., without the metal back plate 201, also contributes to the rigidity of the device 110 as a whole. However, since the one-piece metal back plate 201 allows for thinner devices, the overall device 110, if thinner, may be less rigid than a thicker device having a weaker back plate.

Figure 7:
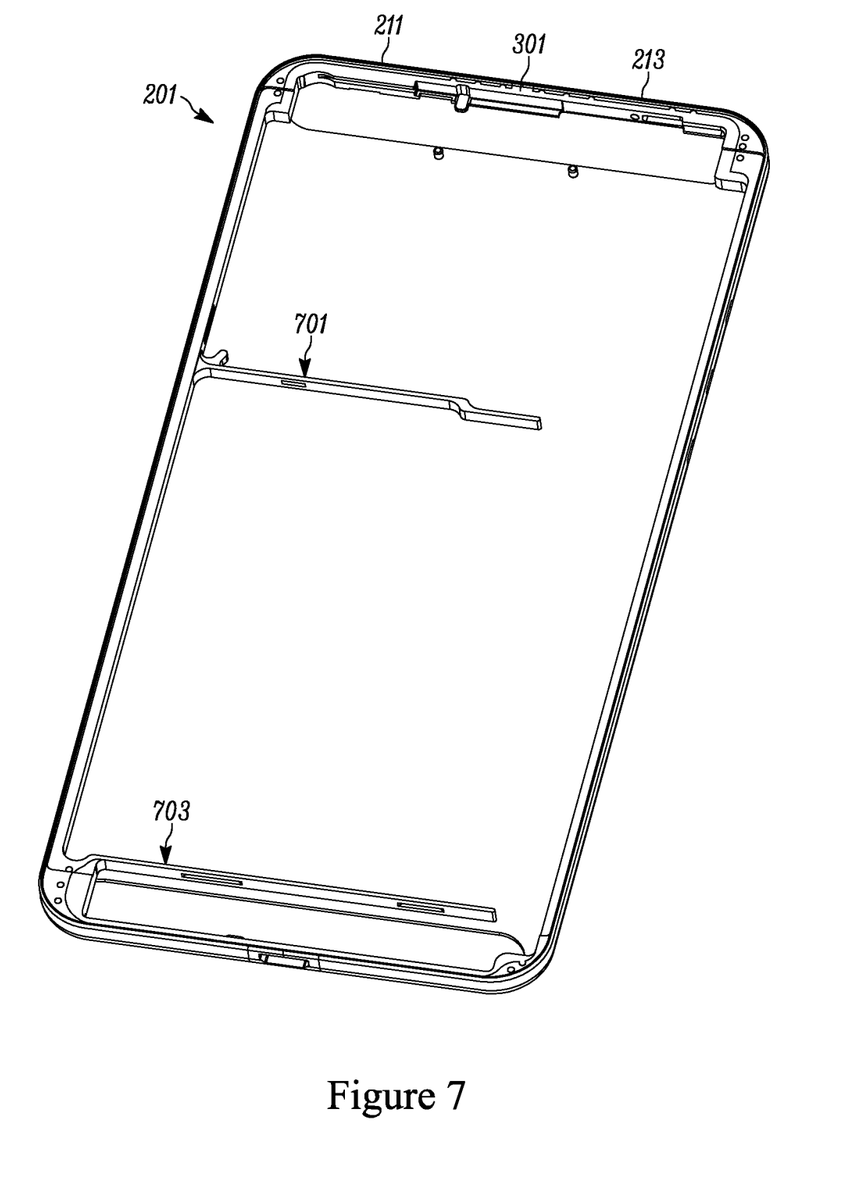
FIG. 7 is a perspective view of the one-piece metal back plate of FIGS. 2-4, further including stiffening ribs in accordance with an embodiment of the disclosed principles.

As such, one or more reinforcement or stiffening ribs may be formed in the one-piece metal back plate 201. FIG. 7 is a front perspective view of the metal back plate 201 showing the placement of a first stiffening rib 701 and a second stiffening rib 703. Each rib 701, 703 is integral with the one-piece metal back plate 201, and extends out of the major plane of the main body 219 of the one-piece metal back plate 201.

Although the internal device components are not shown in this view, device thinness can be maintained by locating the ribs between internal device components such as batteries, PCBs, hatches and the like. Moreover, the ribs 701, 703 need not be straight, but may include turns, angles, notches and other features allowing the rib to clear internal device components.

In the illustrated example, neither rib 701 nor rib 703 entirely traverses the one-piece metal back plate 201, and the first rib 701 is jogged rather than uniformly straight. These shapes are configured to directly accept a battery and printed circuit board in an implementation of the described principles.

Although the illustrated embodiment utilizes two ribs for the sake of example, those of skill in the art will understand that more or fewer than two ribs may be used as reinforcement. Moreover, while the ribs 701, 703 are shown generally traversing the major axis 705 of the one-piece metal back plate 201, and while some transverse element is desired in each rib, one or both ribs 701, 703 may be directed or formed in such a way that they do not actually touch the major axis 705.

Figure 8:
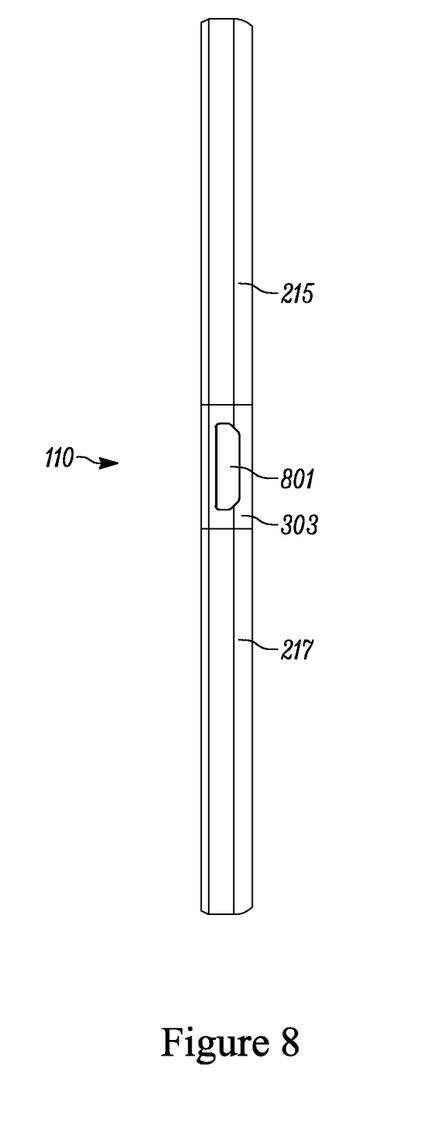
FIG. 8 is a bottom view of a device as in FIG. 1, further showing an I/O port located in an antenna spacer in accordance with an embodiment of the disclosed principles.

As noted above, an advantage of the described one-piece metal back plate is that the nonconductive material in the antenna gaps can also serve the purpose of surrounding an I/O port. FIG. 8 is a simplified bottom view of the device 110 using the described back plate 201 and having an I/O port 801 located in the spacer 801 bridging the gap between the antenna arms 215, 217. Such ports may be heavily grounded, and maintaining separation from the antenna arms 215, 217 allows for more optimal antenna performance.

A system and method for using a one-piece metal back plate in a portable communication device have been disclosed herein. However, in view of the many possible embodiments to which the principles of the present disclosure may be applied, it should be recognized that the embodiments described herein with respect to the drawing figures are meant to be illustrative only and should not be taken as limiting the scope of the claims. Therefore, the techniques as described herein contemplate all such embodiments as may come within the scope of the following claims and equivalents thereof.

We claim:

1. A portable electronic device housing comprising:
   a single-piece conductor having a main body, a periphery and having two antenna arms formed in the periphery, each antenna arm comprising a strip of the conductor electrically connected to the remainder of the main body of the conductor at one end the two antenna arms together partially enclose an opening in the main body, the opening being in the plane of the main body of the back plate;
   a non-conductive material positioned to fill the opening in the; and
   a camera and flash extending through the non-conductive material, the camera and flash being electrically isolated from the single-piece conductor.

2. The portable electronic device housing in accordance with claim 1, wherein the single-piece conductor is comprised of a conductive metal.

3. The portable electronic device housing in accordance with claim 1, wherein the housing includes two openings, each opening being partially bordered by an antenna pair.

4. The portable electronic device housing in accordance with claim 3, wherein the two openings are located at opposite ends of the housing.

5. The portable electronic device housing in accordance with claim 1, wherein the non-conductive material is molded onto the conductor.

6. The portable electronic device housing in accordance with claim 1, wherein the non-conductive material is assembled to the conductor.

7. The portable electronic device housing in accordance with claim 6, wherein the non-conductive material is assembled to the conductor via one or more of glue, snaps or screws.

8. The portable electronic device housing in accordance with claim 1, further comprising at least one stiffening rib integral with the single-piece conductor.

9. The portable electronic device housing in accordance with claim 8, wherein the single-piece conductor includes an inner surface and an outer surface and the inner surface is configured to directly accept a battery and printed circuit board.

* * * * *